United States Patent
Zhu et al.

(10) Patent No.: US 10,242,620 B2
(45) Date of Patent: Mar. 26, 2019

(54) PIXEL CIRCUIT, METHOD FOR DRIVING THE SAME, DISPLAY PANEL, AND DISPLAY DEVICE

(71) Applicant: SHANGHAI TIANMA AM-OLED CO., LTD., Shanghai (CN)

(72) Inventors: Renyuan Zhu, Shanghai (CN); Yue Li, Shanghai (CN); Dongxu Xiang, Shanghai (CN); Yana Gao, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/907,191

(22) Filed: Feb. 27, 2018

(65) Prior Publication Data
US 2018/0190194 A1 Jul. 5, 2018

(30) Foreign Application Priority Data

Aug. 11, 2017 (CN) .......................... 2017 1 0686824

(51) Int. Cl.
*G09G 3/36* (2006.01)
*G09G 3/3233* (2016.01)
*H01L 27/32* (2006.01)
*G09G 3/3258* (2016.01)
*H01L 27/12* (2006.01)

(52) U.S. Cl.
CPC ......... *G09G 3/3233* (2013.01); *G09G 3/3258* (2013.01); *G09G 3/3655* (2013.01); *H01L 27/12* (2013.01); *H01L 27/3265* (2013.01); *G09G 2300/0861* (2013.01); *G09G 2310/0251* (2013.01); *G09G 2310/0262* (2013.01); *G09G 2310/0264* (2013.01); *G09G 2320/043* (2013.01)

(58) Field of Classification Search
CPC .. G09G 3/32; G09G 3/30; G09G 3/34; G09G 3/36; G09G 5/42; H01L 27/32
See application file for complete search history.

(56) References Cited

U.S. PATENT DOCUMENTS

| 2013/0063413 A1* | 3/2013 | Miyake | ................... G09G 3/32 345/212 |
| 2015/0171156 A1* | 6/2015 | Miyake | ............... H01L 29/7869 257/43 |

(Continued)

*Primary Examiner* — Pegeman Karimi
(74) *Attorney, Agent, or Firm* — Kilpatrick Townsend & Stockton LLP

(57) ABSTRACT

Disclosed are a pixel circuit, a method for driving the same, a display panel, a display device, and the pixel circuit which includes a driving transistor structured with double-gates, a first switch transistor, a second switch transistor, a third switch transistor, a fourth switch transistor, a first capacitor, a second capacitor, and a light-emitting element; and the respective transistors and capacitors above cooperate with each other to compensate for threshold voltage of the driving transistor, so that driving current to drive the light-emitting element to emit light is only dependent upon voltage of a data signal, the light-emitting element is avoided from being affected by the threshold voltage of the driver control module, and when the same data signal is applied to different pixel elements, an image at the same brightness can be displayed.

16 Claims, 15 Drawing Sheets

(56) References Cited

U.S. PATENT DOCUMENTS

| | | | |
|---|---|---|---|
| 2016/0042694 A1* | 2/2016 | Lim | G09G 3/3233 |
| | | | 345/78 |
| 2016/0260373 A1* | 9/2016 | Miyake | G09G 3/2007 |
| 2016/0329392 A1* | 11/2016 | Miyake | H01L 27/3262 |
| 2017/0337875 A1* | 11/2017 | Jeon | G09G 3/3258 |
| 2018/0061908 A1* | 3/2018 | Shim | G09G 3/3233 |

* cited by examiner

PIXEL CIRCUIT, METHOD FOR DRIVING THE SAME, DISPLAY PANEL, AND DISPLAY DEVICE

CROSS REFERENCE TO RELATED APPLICATION

This application claims priority to Chinese Patent Application No. 201710686824.2, filed with the Chinese Patent Office on Aug. 11, 2017. The entire disclosure of the above application is incorporated herein by reference.

FIELD

The present disclosure relates to the field of display technologies, and particularly to a pixel circuit, a method for driving the same, a display panel, and a display device.

BACKGROUND

An Organic Light-Emitting Diode (OLED) display is one of focuses in the research field of displays at present, and has low power consumption, a low production cost, self-light-emission, a wide angle of view, a high response speed, and other advantages as compared with a Liquid Crystal Display (LCD). At present, the OLED screen has come to take the place of the traditional LCD screen in the display fields of a mobile phone, a Personal Digital Assistant (PDA), a digital camera, etc., where the design of a pixel circuit is a core technology in the OLED display, and a research thereon is of great significance.

Unlike the LCD in which brightness is controlled using stable voltage, the OLED display, which is current-driven, needs to be controlled using stable current to emit light. There may be non-uniform threshold voltage Vth of driving transistors of pixel circuits due to a process factor, aging of elements, etc., so that current flowing through the different OLED pixels varies, and the pixels display at non-uniform brightness, thus degrading a display effect of the entire image. Although the threshold voltage of the driving transistor can be compensated for in the existing circuit scheme, some problem may remain, for example, a capacitance component and reference voltage is introduced to the light emission current so that it becomes more difficult to adjust gamma voltage in the pixel circuit, and there is a wider demand range of a data signal, thus discouraging power consumption from being lowered.

As illustrated in FIG. 1 which shows a schematic scheme diagram of a pixel circuit in the related art, for example, the circuit includes one driving transistor DT1, three switch transistors, and two capacitors, and threshold voltage of the driving transistor is compensated for in four stages including a node initialization stage, a threshold detection stage, a data writing stage, and a light emission stage. In one embodiment, as illustrated in FIG. 2 which shows a timing diagram corresponding to the pixel circuit illustrated in FIG. 1, in the node initialization stage, the first switch transistor T1 and the second switch transistor T2 are switched on, and the third switch transistor T3 is switched off, and at this time, voltage of the first node N1 is reference voltage Vref transmitted from a data signal terminal, and voltage of the second node N2 is a reset signal Vint transmitted from a reset signal terminal; in the threshold detection stage, the first switch transistor T1 and the third switch transistor T3 are switched on, and the second switch transistor T2 is switched off, and at this time, the voltage of the first node N1 is the reference voltage Vref transmitted from the data signal terminal, and the voltage of the second node N2 is Vref−Vth; in the data writing stage, the first switch transistor T1 and the driving transistor DT1 are switched on, and the second switch transistor T2 and the third switch transistor T3 are switched off, and at this time, the voltage of the first node N1 is a data signal Vdata transmitted from the data signal terminal, and the voltage of the second node N2 is $V_{N2}$=Vref−Vth+C1/C1+C2+$C_{OLED}$(Vdata−Vref) due to the coupling of the capacitors; and in the light emission stage, the third switch transistor T3 and the driving transistor DT1 are switched on, and the first switch transistor T1 and the second switch transistor T2 are switched off, and at this time, driving current is I=K(C2+$C_{OLED}$)(Vdata−Vref)/(C1+C2+$C_{OLED}$), that is, the driving current is dependent upon the capacitors, the voltage of the data signal terminal, and the reference voltage, thus making it more difficult to adjust gamma voltage in the pixel circuit, and widening a voltage demand range of the data signal, which may discourage power consumption from being lowered.

SUMMARY

Embodiments of the disclosure provide a pixel circuit, a method for driving the same, a display panel, and a display device so as to address the problem in the prior art of non-uniform of a displayed image due to varying threshold voltage Vth in the pixel circuit, thus making the pixel circuit more stable.

An embodiment of the disclosure provides a pixel circuit, the pixel circuit includes a driving transistor in a double-gate structure, a first switch transistor, a second switch transistor, a third switch transistor, a fourth switch transistor, a first capacitor, a second capacitor, and a light-emitting element. The second switch transistor is configured to be controlled by a signal of a first scan signal terminal to provide a first gate of the driving transistor with a signal of a data signal terminal. The fourth switch transistor is configured to be controlled by a signal of a second scan signal terminal to provide a first electrode of the driving transistor, or a second electrode of the driving transistor, with a signal of a reset signal terminal. The third switch transistor is configured to be controlled by the signal of the first scan signal terminal to provide a second gate of the driving transistor with a signal of a reference signal terminal. The first switch transistor is configured to be controlled by a signal of a light-emission control terminal to provide the first electrode of the driving transistor with a signal of a first voltage signal terminal. The first capacitor is configured to maintain a stable difference in voltage between the first gate of the driving transistor, and the first voltage signal terminal. The second capacitor is configured to maintain a stable difference in voltage between the second electrode of the driving transistor, and the second gate of the driving transistor. The light-emitting element has a first terminal connected with the second electrode of the driving transistor, and a second terminal connected with a second voltage signal terminal. The driving transistor is configured to be controlled by the first switch transistor, the first capacitor, and the second capacitor to drive the light-emitting element to emit light.

In another aspect, an embodiment of the disclosure further provides a method for driving the pixel circuit above, the method includes a node initialization stage, in a threshold detection stage, a data writing stage, and a light-emission stage. In the node initialization stage, the first scan signal terminal and the second scan signal terminal are provided with a first level signal, the light-emission control terminal is provided with a second level signal, and the data signal terminal is provided with a reference voltage signal. In the threshold detection stage, the first scan signal terminal and the light-emission control terminal are provided with the first level signal, the second scan signal terminal is provided with the second level signal, and the data signal terminal is provided with the reference voltage signal, In the data writing stage, the first scan signal terminal is provided with the first level signal, the second scan signal terminal and the light-emission control terminal are provided with the second level signal, and the data signal terminal is provided with a data voltage signal. In the light-emission stage, the light-emission control terminal is provided with the first level signal, and the first scan signal terminal and the second scan signal terminal are provided with the second level signal.

In another aspect, an embodiment of the disclosure further provides an organic light-emitting display panel. The organic light-emitting display panel includes a plurality of pixel circuits above according to the embodiment of the disclosure, which are arranged in a matrix.

In another aspect, an embodiment of the disclosure further provides a display device including the organic light-emitting display panel above according to the embodiment of the disclosure.

DETAILED DESCRIPTION OF THE EMBODIMENTS

Implementations of the pixel circuit, methods for driving the same, display panels, and display devices according to the embodiments of the disclosure will be described below in details with reference to the drawings. It shall be noted that the embodiments to be described below are merely intended to illustrate and explain the disclosure, but not to limit the disclosure. Embodiments of the disclosure and the features in the embodiments can be combined in any way which does not create a conflict.

An embodiment of the disclosure provides a pixel circuit as illustrated in FIG. 3 to FIG. 6, FIG. 3 to FIG. 6 each shows a schematic scheme diagram of a pixel circuit according to the respective embodiments of the disclosure, and the pixel circuit includes: a driving transistor DT1 in a double-gate structure, a first switch transistor T1, a second switch transistor T2, a third switch transistor T3, a fourth switch transistor T4, a first capacitor C1, a second capacitor C2, and a light-emitting element OLED.

The second switch transistor T2 is configured to be controlled by a signal of a first scan signal terminal Scan1 to provide a first gate of the driving transistor DT1 with a signal of a data signal terminal Data.

Figure 1:
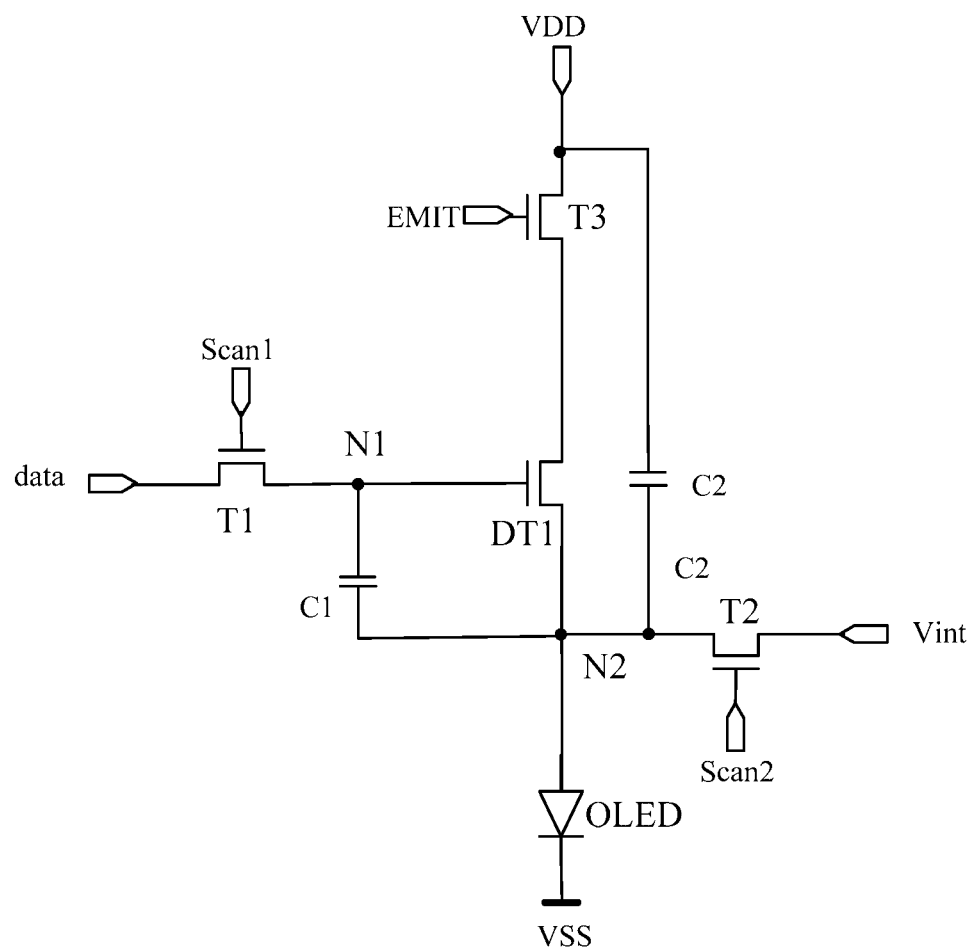
FIG. 1 shows a schematic scheme diagram of a pixel circuit in the prior art.
Figure 2:
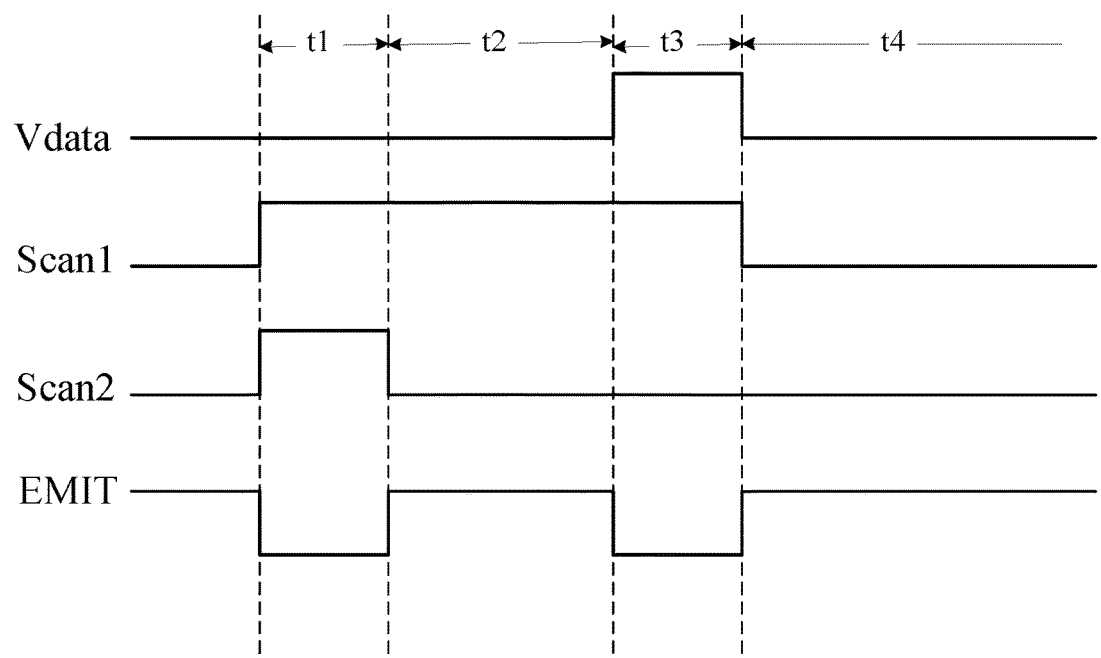
FIG. 2 shows a timing diagram corresponding to the pixel circuit illustrated in FIG. 1.
Figure 3:
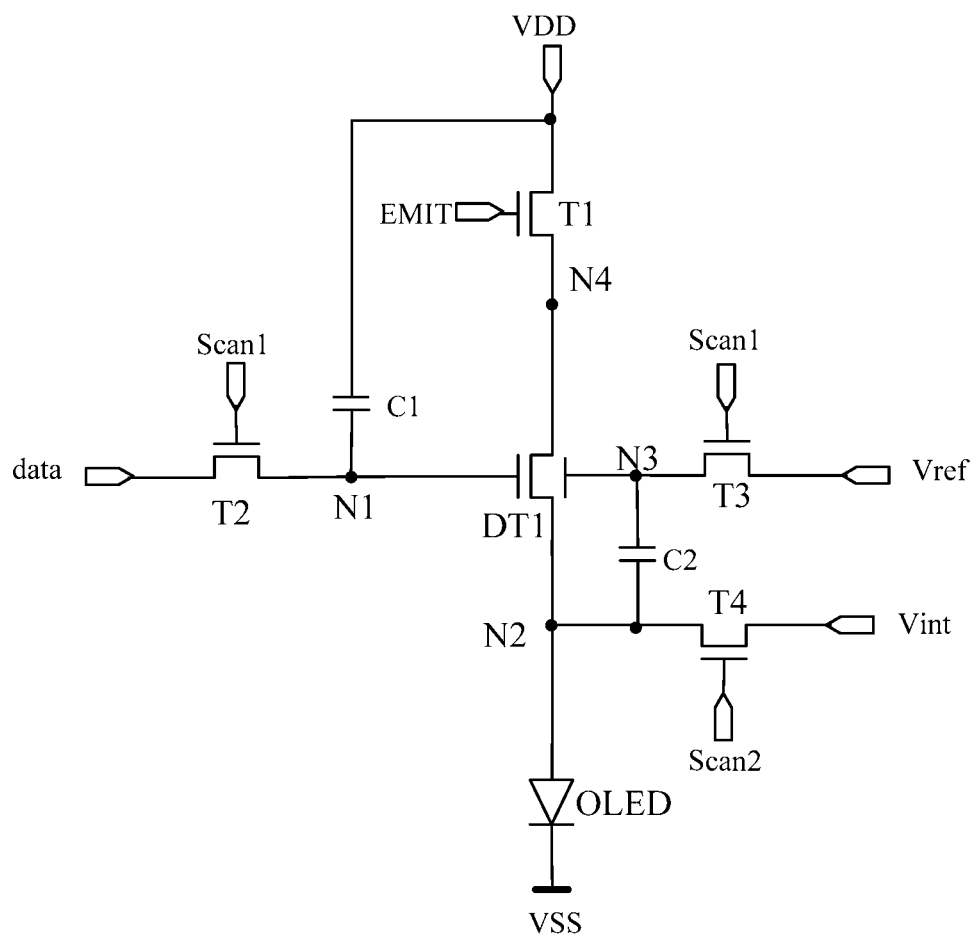
FIG. 3 shows a schematic scheme diagram of a pixel circuit according to an embodiment of the disclosure.
Figure 4:
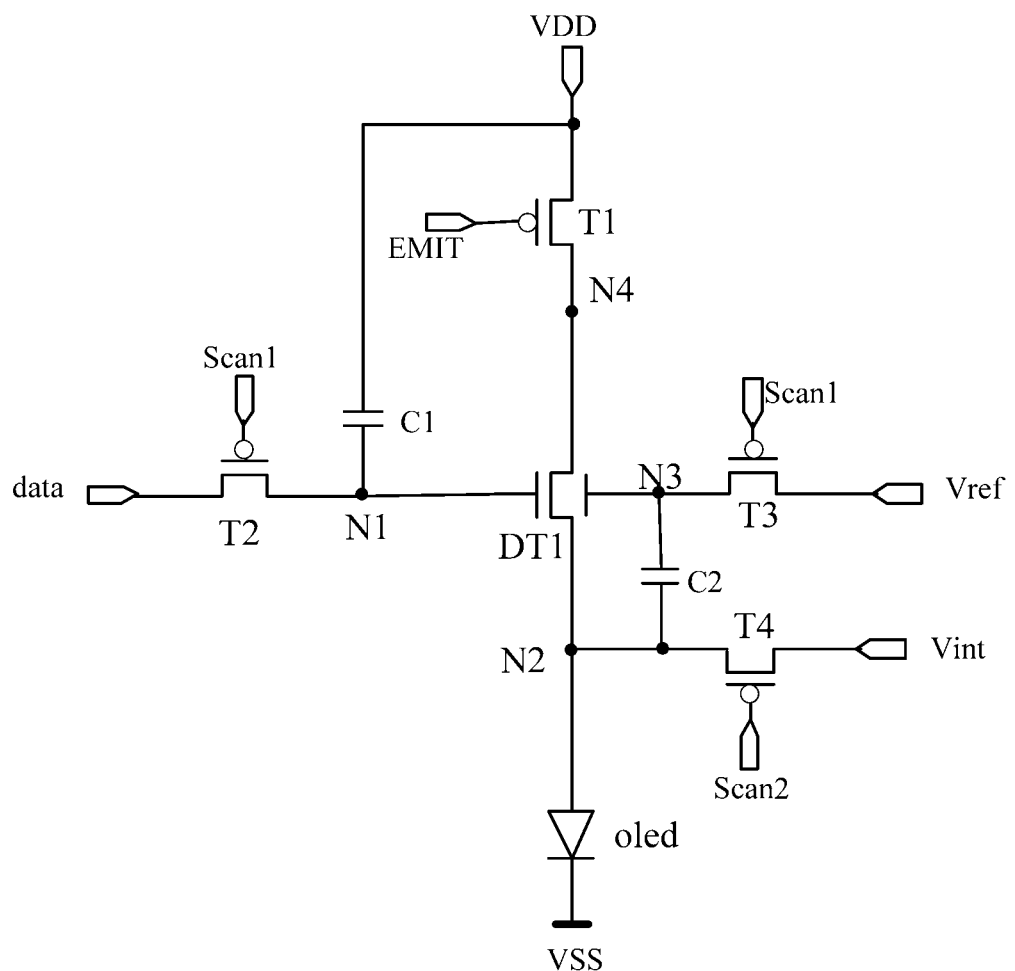
FIG. 4 shows a schematic scheme diagram of a pixel circuit according to another embodiment of the disclosure.
Figure 5:
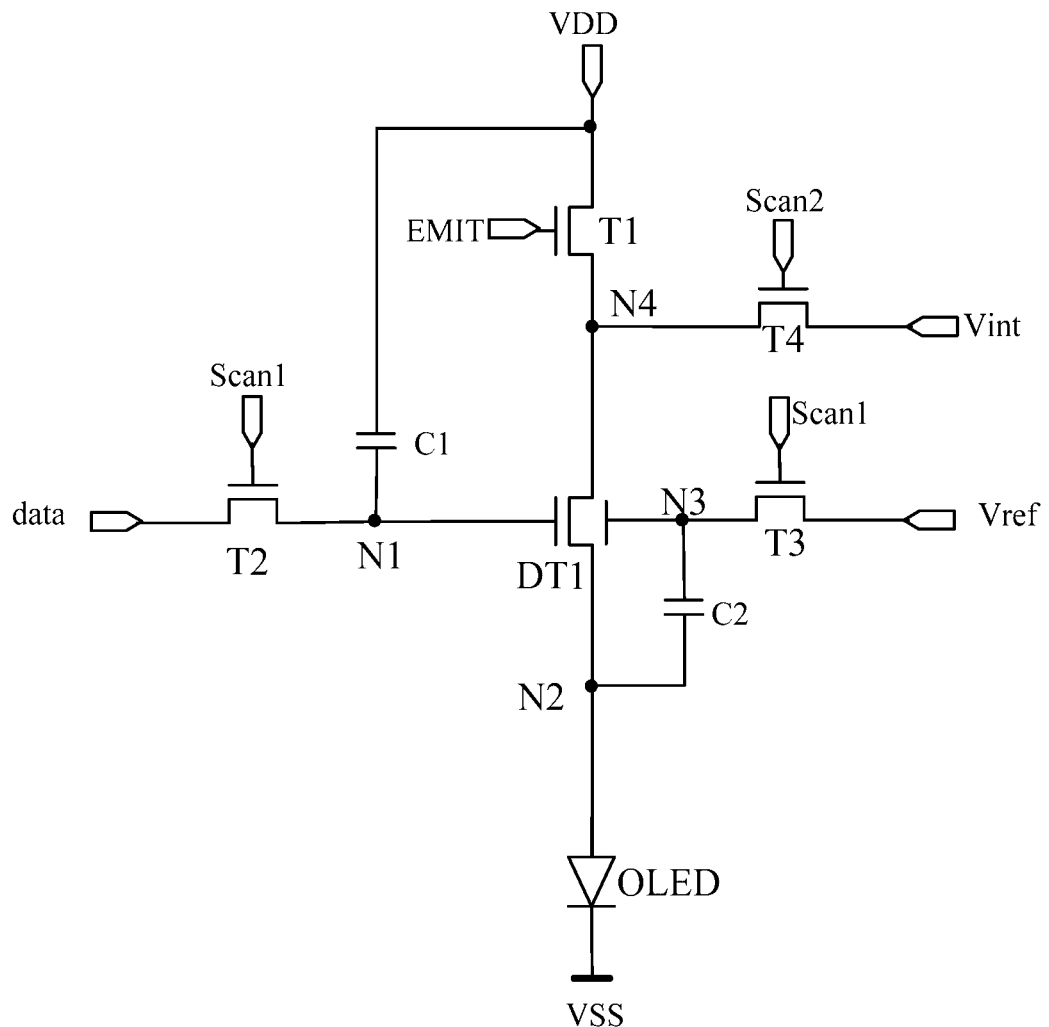
FIG. 5 shows a schematic scheme diagram of a pixel circuit according to another embodiment of the disclosure.
Figure 6:
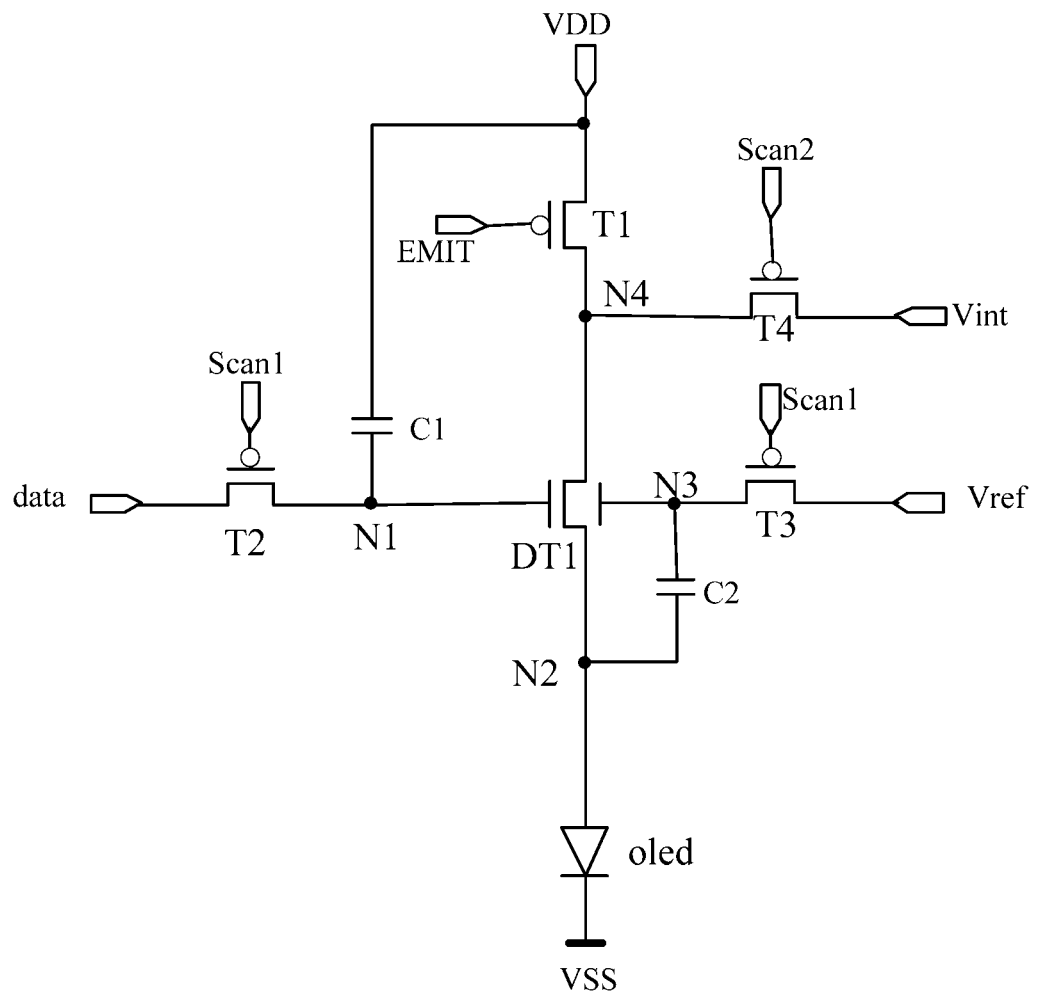
FIG. 6 shows a schematic scheme diagram of a pixel circuit according to another embodiment of the disclosure.

As illustrated in FIG. 3 and FIG. 5, the fourth switch transistor T4 is configured to be controlled by a signal of a second scan signal terminal Scan2 to provide a first electrode of the driving transistor DT1 with a signal of a reset signal terminal Vint; or as illustrated in FIG. 4 and FIG. 6, the fourth switch transistor T4 is configured to be controlled by a signal of a second scan signal terminal Scan2 to provide a second electrode of the driving transistor DT1 with a signal of the reset signal terminal Vint.

The third switch transistor T3 is configured to be controlled by a signal of the first scan signal terminal Scan1 to provide a second gate of the driving transistor DT1 with a signal of a reference signal terminal Vref.

The first switch transistor T1 is configured to be controlled by a light-emission control terminal EMIT to provide the first electrode of the driving transistor DT1 with a signal of a first voltage signal terminal VDD.

The first capacitor C1 is configured to maintain a stable difference in voltage between the first gate of the driving transistor DT1, and the first voltage signal terminal VDD.

The second capacitor C2 is configured to maintain a stable difference in voltage between the second electrode of the driving transistor DT1, and the second gate of the driving transistor DT1.

The light-emitting element OLED has a first terminal connected with the second electrode of the driving transistor DT1, and a second terminal connected with a second voltage signal terminal VSS.

The driving transistor DT1 is configured to be controlled by the first switch transistor T1, the first capacitor C1, and the second capacitor C2 to drive the light-emitting element OLED to emit light.

The pixel circuit above according to the embodiment of the disclosure includes: the driving transistor in the double-gate structure, the first switch transistor, the second switch transistor, the third switch transistor, the fourth switch transistor, the first capacitor, the second capacitor, and the light-emitting element. The respective transistors and capacitors above cooperate with each other to compensate for threshold voltage of the driving transistor, so that driving current to drive the light-emitting element to emit light is only dependent upon the voltage of the data signal, the light-emitting element is avoided from being affected by the threshold voltage of the driving control module, and when the same data signal is applied to different pixel elements, an image at the same brightness can be displayed, thus improving uniformity of the brightness of the image in a display area on a display device, and also making it less difficult to adjust gamma voltage in the pixel circuit, and further optimizing an optional range of the data signal, which may encourage lower power consumption, further the pixel circuit becomes more stable due to the double-gate structure of the driving transistor.

It shall be noted that as illustrated in FIG. 4 and FIG. 6, and when the fourth switch transistor T4 is controlled by the signal of the second scan signal terminal Scan2 to provide the second electrode of the driving transistor DT1 with the signal of the reset signal terminal Vint, that is, to provide a second node N2 with the signal of the reset signal terminal Vint. In the node initialization stage, the second signal terminal Scan2 is provided with a first level signal to reset the second electrode of the driving transistor DT1, and at this time, the second electrode of the driving transistor DT1 is at a low potential, so that current flows from the first electrode of the driving transistor to the second electrode of the driving transistor; and in the other stages, the potential of the second electrode of the driving transistor DT1 is higher than that of the first electrode of the driving transistor DT1, so that current flows from the second electrode of the driving transistor DT1 to the first electrode of the driving transistor DT1. That is, throughout the driving process, the first electrode of the driving transistor DT1 serves as a source electrode in the node initialization stage, and as a drain electrode in the other stages, and the second electrode serves as a drain electrode in the node initialization stage, and as a source electrode in the other stages, so the two electrodes have their functions as the source electrode and the drain electrodes interchanged with each other, thus avoiding the driving transistor from being biased in the same direction for a long period of time to thereby alleviate the threshold voltage and the mobility of the driving transistor from being degraded, and improve an afterimage.

In one embodiment, in the pixel circuit above according to the embodiment of the disclosure, the driving transistor is an N-type transistor, and in order to enable the driving transistor to operate normally, the corresponding voltage output from the first voltage signal terminal is generally positive, and the voltage output from the second voltage signal terminal is generally grounding or negative.

It shall be noted that in the embodiment above of the disclosure, the driving transistor has been described as an N-type transistor by way of an example, but the driving transistor which is a P-type transistor, and designed under the same design principle may also fall into the scope of the disclosure as claimed.

Figure 7:
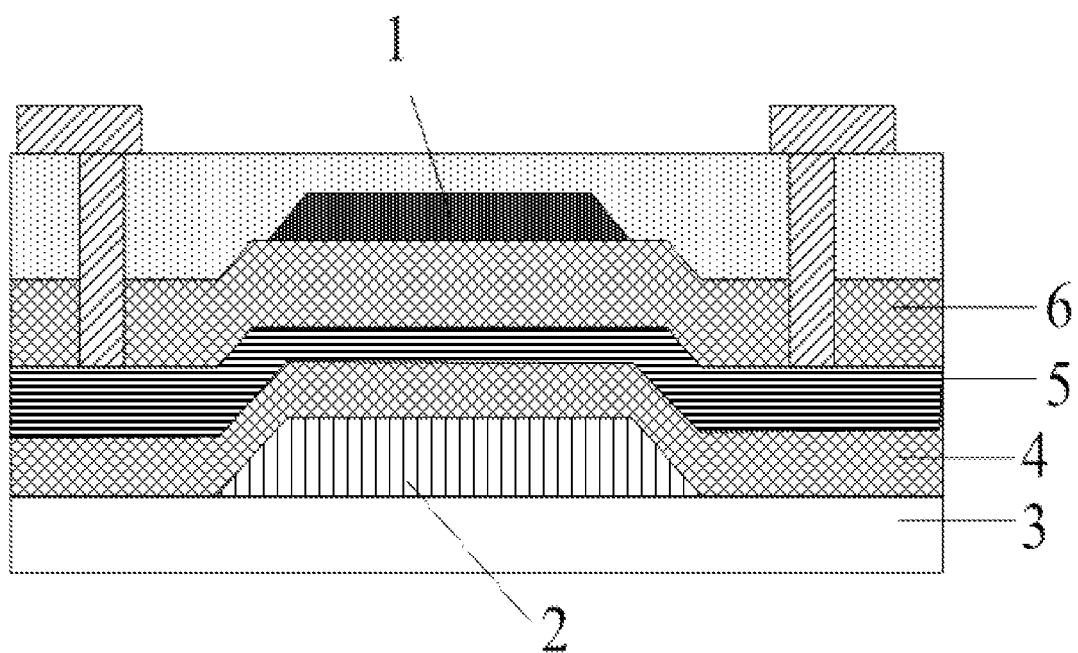
FIG. 7 shows a schematic structural diagram of a driving transistor according to an embodiment of the disclosure.
Figure 8:
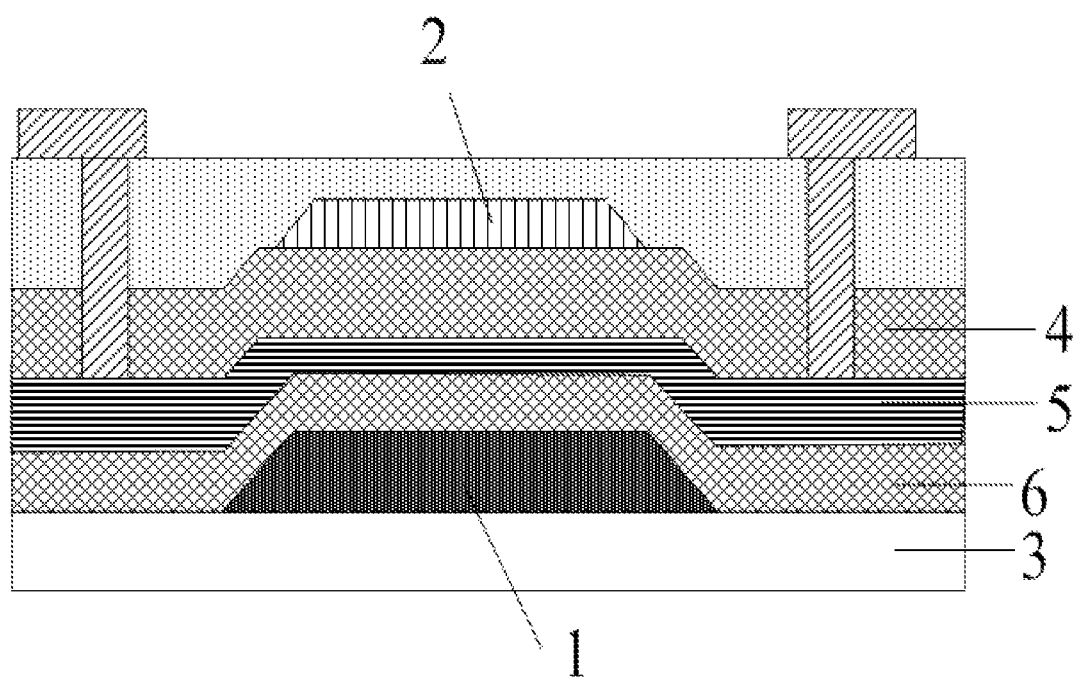
FIG. 8 shows a schematic structural diagram of a driving transistor according to another embodiment of the disclosure.

In the pixel circuit above according to the embodiment of the disclosure, as illustrated in FIG. 7 and FIG. 8, each of which shows a schematic structural diagram of a driving transistor according to an embodiment of the disclosure, a first gate 1 of the driving transistor, and a second gate 2 of the driving transistor are located respectively on two sides of an active layer 5 of the driving transistor.

The first gate of the driving transistor, and the second gate of the driving transistor being located respectively on the two sides of the active layer of the driving transistor refer to that when the first gate of the driving transistor is located on the side of the active layer of the driving transistor facing an array substrate, the second gate of the driving transistor is located on the side of the active layer of the driving transistor away from the array substrate; and when the second gate of the driving transistor is located on the side of the active layer of the driving transistor facing the array substrate, the first gate of the driving transistor is located on the side of the active layer of the driving transistor away from the array substrate, although the embodiment of the disclosure will not be limited thereto.

In one embodiment, in the pixel circuit above according to the embodiment of the disclosure, as illustrated in FIG. 7, the first gate 1 of the driving transistor is located over the active layer 5 of the driving transistor, and a first gate insulation layer 6 is further arranged between the first gate 1 of the driving transistor, and the active layer 5 of the driving transistor.

The second gate 2 of the driving transistor is located under the active layer 5 of the driving transistor, and a second gate insulation layer 4 is further arranged between the second gate 2 of the driving transistor, and the active layer 5 of the driving transistor.

In one embodiment, in the pixel circuit above according to the embodiment of the disclosure, as illustrated in FIG. 8, the first gate 1 of the driving transistor is located under the active layer 5 of the driving transistor, and a first gate insulation layer 6 is further arranged between the first gate 1 of the driving transistor, and the active layer 5 of the driving transistor.

The second gate 2 of the driving transistor is located over the active layer 5 of the driving transistor, and a second gate insulation layer 4 is further arranged between the second gate 2 of the driving transistor, and the active layer 5 of the driving transistor.

It shall be noted that being above the active layer 5 refers to being located on the side of the active layer 5 away from the array substrate 3, and being below the active layer 5 refers to being located on the side of the active layer 5 facing the array substrate 3.

In the pixel circuit above according to the embodiment of the disclosure, as illustrated in FIG. 3 to FIG. 6, the first switch transistor T1 has a gate connected with the light-emission control terminal EMIT, a first electrode connected with the first voltage signal terminal VDD, and a second electrode connected with the second electrode of the driving transistor DT1 as illustrated in FIG. 3 and FIG. 5, or a second electrode connected respectively with the second electrode of the driving transistor DT1, and a second electrode of the fourth switch transistor T4 as illustrated in FIG. 4 and FIG. 6.

As illustrated in FIG. 3 and FIG. 5, the first switch transistor T1 can be an N-type transistor, and when a light-emission control signal transmitted from the light-emission control terminal EMIT is at a high level, the first switch transistor T1 is switched on, and when the light-emission control signal transmitted from the light-emission control terminal EMIT is at a low level, the first switch transistor T1 is switched off; or as illustrated in FIG. 4 and FIG. 6, the first switch transistor T1 can alternatively be a P-type transistor, and when a light-emission control signal transmitted from the light-emission control terminal EMIT is at a low level, the first switch transistor T1 is switched on, and when the light-emission control signal transmitted from the light-emission control terminal EMIT is at a high level, the first switch transistor T1 is switched off, although the embodiment of the disclosure will not be limited thereto.

In the pixel circuit above according to the embodiment of the disclosure, when the first switch transistor is controlled by a light-emission control signal transmitted from the light-emission control terminal to be switched on, a first voltage signal transmitted from the first voltage signal terminal is transmitted to the fourth node through the first switch transistor which is switched on, so that driving current can be formed by the driving transistor to drive the light-emitting element to emit light.

In the pixel circuit above according to the embodiment of the disclosure, as illustrated in FIG. 3 to FIG. 6, the second switch transistor T2 has a gate connected with the first scan signal terminal Scan1, a first electrode connected with the data signal terminal Data, and a second electrode connected with the first gate of the driving transistor DT1.

In one embodiment, as illustrated in FIG. 3 and FIG. 5, the second switch transistor T2 can be an N-type transistor, and when a first scan signal transmitted from the first scan signal terminal Scan1 is at a high level, the second switch transistor T2 is switched on, and when the first scan signal transmitted from the first scan signal terminal Scan1 is at a low level, the second switch transistor T2 is switched off; or as illustrated in FIG. 4 and FIG. 6, the second switch transistor T2 can alternatively be a P-type transistor, and when a first scan signal transmitted from the first scan signal terminal Scan1 is at a low level, the second switch transistor T2 is switched on, and when the first scan signal transmitted from the first scan signal terminal Scan1 is at a high level, the second switch transistor T2 is switched off, although the embodiment of the disclosure will not be limited thereto.

In the pixel circuit above according to the embodiment of the disclosure, when the second switch transistor is controlled by the first scan signal transmitted from the first scan signal terminal to be switched on, the data signal is transmitted to the first node through the second switch transistor which is switched on, to thereby reset the voltage of the first node.

In the pixel circuit above according to the embodiment of the disclosure, as illustrated in FIG. 3 to FIG. 6, the third switch transistor T3 has a gate connected with the first scan signal terminal Scan1, a first electrode connected with the reference signal terminal Vref, and a second electrode connected with the second gate of the driving transistor DT1.

In one embodiment, as illustrated in FIG. 3 and FIG. 5, the third switch transistor T3 can be an N-type transistor, when a first scan signal transmitted from the first scan signal terminal Scan1 is at a high level, the third switch transistor T3 is switched on, and when the first scan signal transmitted from the first scan signal terminal Scan1 is at a low level, the third switch transistor T3 is switched off; or as illustrated in FIG. 4 and FIG. 6, the third switch transistor T3 can alternatively be a P-type transistor, when a first scan signal transmitted from the first scan signal terminal Scan1 is at a low level, the third switch transistor T3 is switched on, and when the first scan signal transmitted from the first scan signal terminal Scan1 is at a high level, the third switch transistor T3 is switched off, although the embodiment of the disclosure will not be limited thereto.

In the pixel circuit above according to the embodiment of the disclosure, when the third switch transistor is controlled by the first scan signal transmitted from the first scan signal terminal to be switched on, the reference signal transmitted from the reference signal terminal is transmitted to the third node through the third switch transistor which is switched on, to thereby reset the voltage of the third node.

In the pixel circuit above according to the embodiment of the disclosure, as illustrated in FIG. 3 to FIG. 6, the fourth switch transistor T4 has a gate connected with the second scan signal terminal Scan2, a first electrode connected with the reset signal terminal Vint, and a second electrode connected with the first electrode of the driving transistor DT1, or the second electrode connected respectively with the second electrode of the driving transistor DT1, and the second electrode of the first switch transistor T1.

In one embodiment, as illustrated in FIG. 3 and FIG. 5, the fourth switch transistor T4 can be an N-type transistor, when a second scan signal transmitted from the second scan signal terminal Scan2 is at a high level, the fourth switch transistor T4 is switched on, and when the second scan signal transmitted from the second scan signal terminal Scan2 is at a low level, the fourth switch transistor T4 is switched off; or as illustrated in FIG. 4 and FIG. 6, the fourth switch transistor T4 can alternatively be a P-type transistor, when a second scan signal transmitted from the second scan signal terminal Scan2 is at a low level, the fourth switch transistor T4 is switched on, and when the second scan signal transmitted from the second scan signal terminal Scan2 is at a high level, the fourth switch transistor T4 is switched off, although the embodiment of the disclosure will not be limited thereto.

In the pixel circuit above according to the embodiment of the disclosure, when the fourth switch transistor is controlled by the second scan signal transmitted from the second scan signal terminal to be switched on, the reset signal transmitted from the reset signal terminal is transmitted to the second node or the fourth node through the fourth switch transistor which is switched on, to thereby reset the voltage of the second node or the fourth node.

In the pixel circuit above according to the embodiment of the disclosure, as illustrated in FIG. 3 to FIG. 6, the first capacitor C1 has a first terminal connected respectively with the first gate of the driving transistor DT1, and the second electrode of the second switch transistor T2, and a second terminal connected with the first voltage signal terminal.

Here the first capacitor is used as a coupling capacitor to maintain a stable difference in voltage between the first node and the first voltage signal terminal.

In the pixel circuit above according to the embodiment of the disclosure, as illustrated in FIG. 3 to FIG. 6, the second capacitor C2 has a first terminal connected with the first electrode of the driving transistor DT1, and a second terminal connected respectively with the second gate of the driving transistor DT1, and the second electrode of the third switch transistor T3.

Here the second capacitor is used as a coupling capacitor between the second node and the third node to maintain a stable difference in voltage between the second node and the third node.

In the pixel circuit above according to the embodiment of the disclosure, all the switch transistors are N-type transistors or P-type transistors, although the embodiment of the disclosure will not be limited thereto.

In one embodiment, all of the driving transistors and the switch transistors as referred to in the pixel circuit above according to the embodiment of the disclosure can be designed as N-type transistors or P-type transistors to thereby simplify a process flow of fabricating the pixel circuit.

In one embodiment, in the pixel circuit above according to the embodiment of the disclosure, the driving transistors and the switch transistors can be Thin Film Transistors (TFTs), or can be Metal Oxide Semiconductors (MOS's), although the embodiment of the disclosure will not be limited thereto. In one embodiment, when the first electrodes of these transistors are source electrodes, the second electrodes thereof are drain electrodes, or when the first electrodes of these transistors are drain electrodes, the second electrodes thereof are source electrodes, so their functions can be interchanged with each other dependent upon the different types of the transistors and the different input signals, instead of being distinguished from each other.

In the pixel circuit above according to the embodiment of the disclosure, at least one of the switch transistors is in a double-gate structure.

Here in a real application, the switch transistor can be designed in double-gate structure to reduce leakage current in the switch transistor which is switched off, to thereby prevent the leakage current produced in the switch transistor from interfering with the switch transistor, so as to alleviate the driving current in the switch transistor from being affected.

An operating process of the pixel circuit above according to the embodiment of the disclosure will be described below with reference to circuit timing diagrams thereof taking the structures of the pixel circuit illustrated in FIG. 3 and FIG. 5 respectively as an example. It shall be noted that 1 and 0 are logic levels, and merely intended to better explain the particular operating process according to the embodiment of the disclosure, but not to suggest the voltage applied to the gates of the respective switch transistors in one embodiment.

First Embodiment

Figure 9:
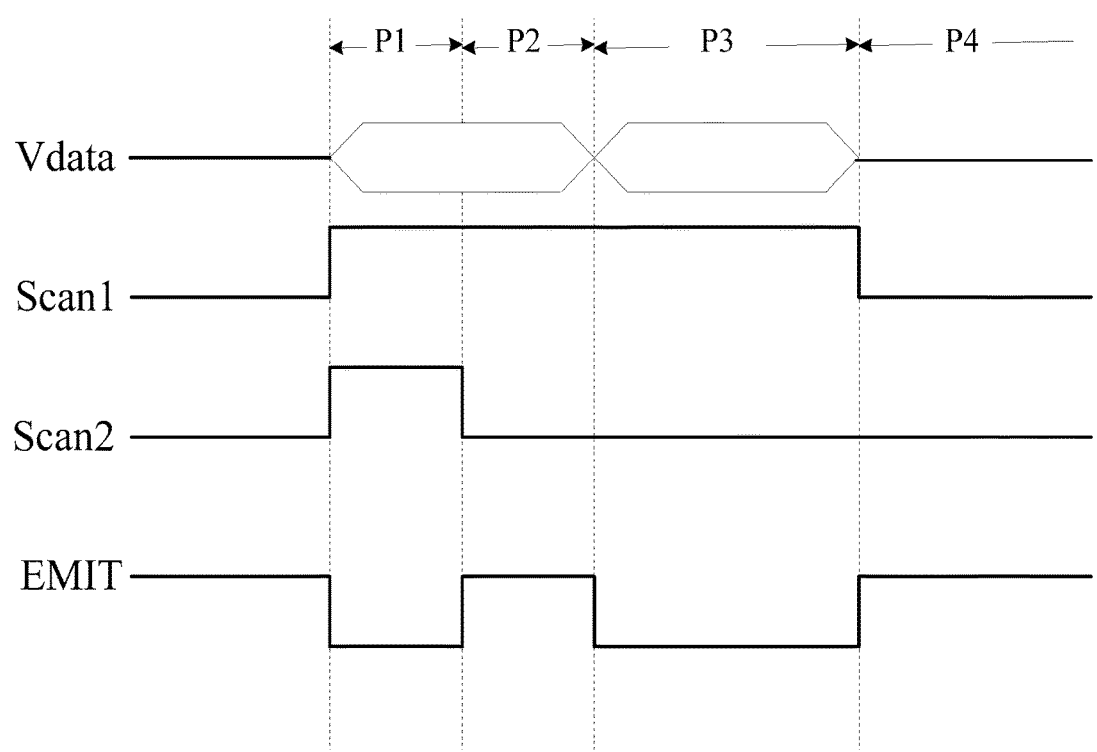
FIG. 9 shows a timing diagram corresponding to the pixel circuit illustrated in FIG. 3 or FIG. 5.

Taking the structure of the pixel circuit illustrated in FIG. 3 as an example, and a corresponding input-output timing diagram thereof is as illustrated in FIG. 9. In one embodiment, there are generally four selected stages including a node initialization stage P1, a threshold detection stage P2, a data writing stage P3, and a light-emission stage P4 shown in the input-output timing diagram as illustrated in FIG. 9.

In the node initialization stage P1, EMIT=0, Scan1=1, and Scan2=1.

With Scan1=1, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1. With Scan2=1, the fourth switch transistor T4 is switched on to provide the second node N2 with the reset signal V2 transmitted from the reset signal terminal Vint, so the potential of the second node N2 is V2. With EMIT=0, the first switch transistor T1 is switched off, and the organic light-emitting diode OLED does not emit light.

In the threshold detection stage P2, EMIT=1, Scan1=1, and Scan2=0.

With Scan1=1, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1, and the driving transistor DT1 is switched on. With Scan2=0, the fourth switch transistor T4 is switched off. With EMIT=1, the first switch transistor T1 is switched on to provide the driving transistor DT1 with the first voltage signal transmitted from the first voltage signal terminal VDD, and at this time, the potential of the second node N2 is the reference signal V1 minus the threshold voltage Vth of the driving transistor, so the potential of the second node N2 is lower than the sum of the potential of the second voltage signal terminal VSS, and the potential of the light-emitting element OLED itself, i.e., $V_{N2}$=V1−Vth<VSS+VOLED, so the organic light-emitting diode OLED does not emit light.

In the data writing stage P3, EMIT=0, Scan1=1, and Scan2=0.

With Scan1=1, the second switch transistor T2 is switched on to provide the first node N1 with the data signal Vdata transmitted from the data signal terminal Data, so the potential of the first node N1 is Vdata; and the third switch transistor T3 is switched on to provide the third node N3 with the reference signal V1 transmitted from the reference signal terminal Vref, so the potential of the third node N3 is V1. With Scan2=0, the fourth switch transistor T4 is switched off, and at this time, the potential of the second node $V_{N2}$ is V1−Vth. With EMIT=0, the first switch transistor T1 is switched off, and the organic light-emitting diode OLED does not emit light.

In the light-emission stage P4, EMIT=1, Scan1=0, and Scan2=0.

With Scan1=0, the second switch transistor T2 and the third switch transistor T3 are switched off, and the potential of the first node N1 is maintained at the potential as in the P3 stage, so the potential of the first node N1 is Vdata. With EMIT=1, the first switch transistor T1 is switched on to provide the fourth node N4 with the voltage output from the first voltage signal terminal VDD, and the light-emitting element OLED is driven by the driving transistor DT1 to emit light; and at this time, the potential of the second node $V_{N2}$ is VSS+VOLED, so the potential of the second node N2 is changed from the potential of the second node N2 in the P3 stage by ΔV=VSS+VOLED−V1+Vth. At this time, the potential of the third node N3 is V1+ΔV=VSS+VOLED+Vth due to the coupling of the second capacitor C2, and at this time, the difference in voltage between the gate and the drain of the driving transistor DT1 is Vgs=$V_{N1}$+$V_{N3}$−$V_{N2}$=Vdata+Vth, and the driving current in the driving transistor DT1 is I=k(Vgs−Vth)$^2$=k(Vdata+Vth−Vth)$^2$=k(Vdata)$^2$, so that the organic light-emitting diode OLED is driven by the driving current in the driving transistor DT1 to emit light.

Second Embodiment

Figure 10:
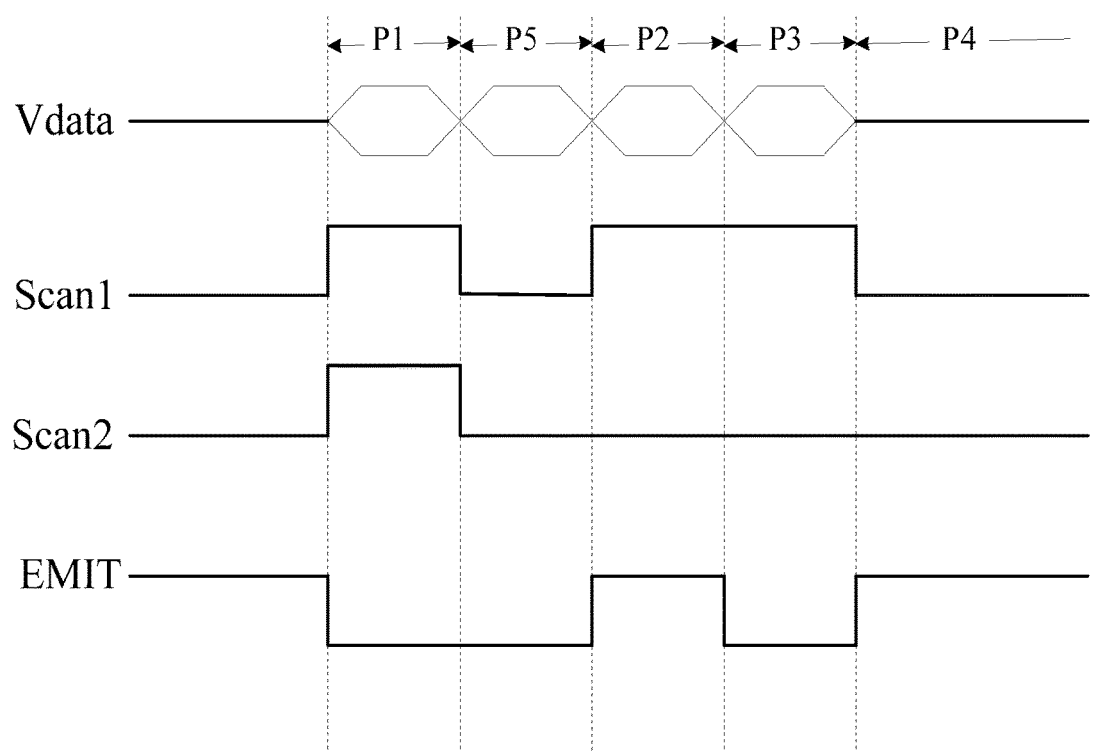
FIG. 10 shows another timing diagram corresponding to the pixel circuit illustrated in FIG. 3 or FIG. 5.

Taking the structure of the pixel circuit illustrated in FIG. 3 as an example, and a corresponding input-output timing diagram thereof is as illustrated in FIG. 10. In one embodiment, there are generally five selected stages including a node initialization stage P1, a hold stage P5, a threshold detection stage P2, a data writing stage P3, and a light-emission stage P4 shown in the input-output timing diagram as illustrated in FIG. 10, where this timing is applicable in the case there is also the $0^{th}$ row of pixels before the first row of pixels, and the extension direction of gates is specified as the row direction. While the respective rows of pixel circuits are being scanned, the node initialization stage P1 and the hold stage P5 of the next row of pixels are performed at the same time as the threshold detection stage P2 and the data writing stage P3 of the previous row of pixels, and this timing is preset to thereby lengthen a period of time of the threshold detection stage P2. As in the first embodiment, it takes a period of time of 1H to perform the four stages, where the period of time of 1H is a period of time it takes to scan a row of pixels, and it takes a period of time of ¼H to perform the threshold detection stage P2; and in the timing according to the second embodiment, since the node initialization stage P1 and the hold stage P5 of the next row of pixels are performed at the same time as the threshold detection stage P2 and the data writing stage P3 of the previous row of pixels, it takes a period of time of 2H to perform the four stages throughout the timing, and it takes a period of time of ½H to perform the threshold detection stage P2, so that the period of time of the threshold detection stage P2 is lengthened, thus lengthening a period of time for detecting the threshold voltage, and making the threshold voltage detected more accurately, which may alleviate non-uniformity of a displayed image as a result of inaccurate detection of the threshold voltage detected in a period of time shortened due to a larger number of pixels.

In the node initialization stage P1, EMIT=0, Scan1=1, and Scan2=1.

With Scan1=1, the second switch transistor T2 is switched on to provide the first node N1 with the first reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1. With Scan2=1, the fourth switch transistor T4 is switched on to provide the second node N2 with the reset signal V2 transmitted from the reset signal terminal Vint, so the potential of the second node N2 is V2. With EMIT=0, the first switch transistor T1 is switched off, and the organic light-emitting diode OLED does not emit light.

In the hold stage P5, EMIT=0, Scan1=0, and Scan2=0.

With EMIT=0, Scan1=0, and Scan2=0, the respective switch transistors are switched off, and the respective nodes maintain their potentials as in the last stage.

In the threshold detection stage P2, EMIT=1, Scan1=1, and Scan2=0.

With Scan1=1, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1, and the driving transistor DT1 is switched on. With Scan2=0, the fourth switch transistor T4 is switched off. With EMIT=1, the first switch transistor T1 is switched on to provide the driving transistor DT1 with the first voltage signal transmitted from the first voltage signal terminal VDD, and at this time, the potential of the second node N2 is the reference signal V1 minus the threshold voltage Vth of the driving transistor, so the potential of the second node N2 is lower than the sum of the potential of the second voltage signal terminal VSS, and the potential of the light-emitting element OLED itself, i.e., $V_{N2}$=V1−Vth<VSS+VOLED, so the organic light-emitting diode OLED does not emit light.

In the data writing stage P3, EMIT=0, Scan1=1, and Scan2=0.

With Scan1=1, the second switch transistor T2 is switched on to provide the first node N1 with the data signal Vdata transmitted from the data signal terminal Data, so the potential of the first node N1 is Vdata; and the third switch transistor T3 is switched on to provide the third node N3 with the reference signal V1 transmitted from the reference signal terminal Vref, so the potential of the third node N3 is V1. With Scan2=0, the fourth switch transistor T4 is switched off, and at this time, the potential of the second node N2 is V1−Vth. With EMIT=0, the first switch transistor T1 is switched off, and the organic light-emitting diode OLED does not emit light.

In the light-emission stage P4, EMIT=1, Scan1=0, and Scan2=0.

With Scan1=0, the second switch transistor T2 and the third switch transistor T3 are switched off, and the potential of the first node N1 is maintained at the potential as in the P3 stage, so the potential of the first node N1 is Vdata. With EMIT=1, the first switch transistor T1 is switched on to provide the fourth node N4 with the voltage output from the first voltage signal terminal VDD, and the light-emitting element OLED is driven by the driving transistor DT1 to emit light; and at this time, the potential of the second node N2 is VSS+VOLED, so the potential of the second node N2 is changed from the potential thereof in the P3 stage by ΔV=VSS+VOLED−V1+Vth. At this time, the potential of the third node N3 is V1+ΔV=VSS+VOLED+Vth due to the coupling of the second capacitor C2, and at this time, the difference in voltage between the gate and the drain of the driving transistor DT1 is Vgs=$V_{N1}$+$V_{N3}$−$V_{N2}$=Vdata+Vth, and the driving current in the driving transistor DT1 is I=k(Vgs−Vth)$^2$=k(Vdata+Vth−Vth)$^2$=k(Vdata)$^2$, so that the organic light-emitting diode OLED is driven by the driving current in the driving transistor DT1 to emit light.

Third Embodiment

Taking the structure of the pixel circuit illustrated in FIG. 5 as an example, and a corresponding input-output timing diagram thereof is as illustrated in FIG. 9. In one embodiment, there are generally four selected stages including a node initialization stage P1, a threshold detection stage P2, a data writing stage P3, and a light-emission stage P4 shown in the input-output timing diagram as illustrated in FIG. 9.

In the node initialization stage P1, EMIT=0, Scan1=1, and Scan2=1.

With Scan1=1, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1. With Scan2=1, the fourth switch transistor T4 is switched on to provide the fourth node N4 with the reset signal V2 transmitted from the reset signal terminal Vint, so the potential of the fourth node N4 is V2. With EMIT=0, the first switch transistor T1 is switched off, and the organic light-emitting diode OLED does not emit light.

In the threshold detection stage P2, EMIT=1, Scan1=1, and Scan2=0.

With Scan1=1, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1, and the driving transistor DT1 is switched on. With Scan2=0, the fourth switch transistor T4 is switched off. With EMIT=1, the first switch transistor T1 is switched on to provide the driving transistor DT1 with the first voltage signal transmitted from the first voltage signal terminal VDD, and at this time, the potential of the fourth node N4 is the reference signal V1 minus the threshold voltage Vth of the driving transistor, so the potential of the fourth node N4 is lower than the sum of the potential of the second voltage signal terminal VSS, and the potential of the light-emitting element OLED itself, i.e., $V_{N4}$=V1−Vth<VSS+VOLED, so the organic light-emitting diode OLED does not emit light.

In the data writing stage P3, EMIT=0, Scan1=1, and Scan2=0.

With Scan1=1, the second switch transistor T2 is switched on to provide the first node N1 with the data signal Vdata transmitted from the data signal terminal Data, so the potential of the first node N1 is Vdata; and the third switch transistor T3 is switched on to provide the third node N3 with the reference signal V1 transmitted from the reference signal terminal Vref, so the potential of the third node N3 is V1. With Scan2=0, the fourth switch transistor T4 is switched off, and at this time, the potential of the fourth node N4 is V1−Vth. With EMIT=0, the first switch transistor T1 is switched off, and the organic light-emitting diode OLED does not emit light.

In the light-emission stage P4, EMIT=1, Scan1=0, and Scan2=0.

With Scan1=0, the second switch transistor T2 and the third switch transistor T3 are switched off, and the potential of the first node N1 is maintained at the potential as in the P3 stage, so the potential of the first node N1 is Vdata. With EMIT=1, the first switch transistor T1 is switched on to provide the fourth node N4 with the voltage output from the first voltage signal terminal VDD, and the light-emitting element OLED is driven by the driving transistor DT1 to emit light; and at this time, the potential of the second node N2 is VSS+VOLED, so the potential of the second node N2 is changed from the potential of thereof in the P3 stage by $\Delta V$=VSS+VOLED−V1+Vth. At this time, the potential of the third node N3 is V1+$\Delta V$=VSS+VOLED+Vth due to the coupling of the second capacitor C2, and at this time, the difference in voltage between the gate and the drain of the driving transistor DT1 is Vgs=$V_{N1}$+$V_{N3}$−$V_{N2}$=Vdata+Vth, and the driving current in the driving transistor DT1 is I=k(Vgs−Vth)$^2$=k(Vdata+Vth−Vth)$^2$=k(Vdata)$^2$, so that the organic light-emitting diode OLED is driven by the driving current in the driving transistor DT1 to emit light.

Fourth Embodiment

Taking the structure of the pixel circuit illustrated in FIG. 5 as an example, and a corresponding input-output timing diagram thereof is as illustrated in FIG. 10. In one embodiment, there are generally five selected stages including a node initialization stage P1, a hold stage P5, a threshold detection stage P2, a data writing stage P3, and a light-emission stage P4 shown in the input-output timing diagram as illustrated in FIG. 10, where this timing is applicable in the case there is also the 0$^{th}$ row of pixels before the first row of pixels, and the extension direction of gates is specified as the row direction. While the respective rows of pixel circuits are being scanned, the node initialization stage P1 and the hold stage P5 of the next row of pixels are performed at the same time as the threshold detection stage P2 and the data writing stage P3 of the previous row of pixels, and this timing is preset to thereby lengthen a period of time of the threshold detection stage P2. As in the third embodiment, it takes a period of time of 1H to perform the four stages, where the period of time of 1H is a period of time it takes to scan a row of pixels, and it takes a period of time of ¼H to perform the threshold detection stage P2; and in the timing according to the fourth embodiment, since the node initialization stage P1 and the hold stage P5 of the next row of pixels are performed at the same time as the threshold detection stage P2 and the data writing stage P3 of the previous row of pixels, it takes a period of time of 2H to perform the four stages throughout the timing, and it takes a period of time of ½H to perform the threshold detection stage P2, so that the period of time of the threshold detection stage P2 is lengthened, thus lengthening a period of time for detecting the threshold voltage, and making the threshold voltage detected more accurately, which may alleviate non-uniformity of a displayed image as result of inaccurate detection of the threshold voltage detected in a period of time shortened due to a larger number of pixels.

In the node initialization stage P1, EMIT=0, Scan1=1, and Scan2=1.

With Scan1=1, the second switch transistor T2 is switched on to provide the first node N1 with the first reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1. With Scan2=1, the fourth switch transistor T4 is switched on to provide the fourth node N4 with the reset signal V2 transmitted from the reset signal terminal Vint, so the potential of the fourth node N4 is V2. With EMIT=0, the first switch transistor T1 is switched off, and the organic light-emitting diode OLED does not emit light.

In the hold stage P5, EMIT=0, Scan1=0, and Scan2=0.

With EMIT=0, Scan1=0, and Scan2=0, the respective switch transistors are switched off, and the respective nodes maintain their potentials as in the last stage.

In the threshold detection stage P2, EMIT=1, Scan1=1, and Scan2=0.

With Scan1=1, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1, and the driving transistor DT1 is switched on. With Scan2=0, the fourth switch transistor T4 is switched off. With EMIT=1, the first switch transistor T1 is switched on to provide the driving transistor DT1 with the first voltage signal transmitted from the first voltage signal terminal VDD, and at this time, the potential of the fourth node N4 is the reference signal V1 minus the threshold voltage Vth of the driving transistor, so the potential of the fourth node N4 is lower than the sum of the potential of the second voltage signal terminal VSS, and the potential of the light-emitting element OLED itself, i.e., $V_{N4}$=V1−Vth<VSS+VOLED, so the organic light-emitting diode OLED does not emit light.

In the data writing stage P3, EMIT=0, Scan1=1, and Scan2=0.

With Scan1=1, the second switch transistor T2 is switched on to provide the first node N1 with the data signal Vdata transmitted from the data signal terminal Data, so the potential of the first node N1 is Vdata; and the third switch transistor T3 is switched on to provide the third node N3 with the reference signal V1 transmitted from the reference signal terminal Vref, so the potential of the third node N3 is V1. With Scan2=0, the fourth switch transistor T4 is switched off, and at this time, the potential of the second node N2 is V1−Vth. With EMIT=0, the first switch transistor T1 is switched off, and the organic light-emitting diode OLED does not emit light.

In the light-emission stage P4, EMIT=1, Scan1=0, and Scan2=0.

With Scan1=0, the second switch transistor T2 and the third switch transistor T3 are switched off, and the potential of the first node N1 is maintained at the potential as in the P3 stage, so the potential of the first node N1 is Vdata. With EMIT=1, the first switch transistor T1 is switched on to provide the fourth node N4 with the voltage output from the first voltage signal terminal VDD, and the light-emitting element OLED is driven by the driving transistor DT1 to emit light; and at this time, the potential of the second node N2 is VSS+VOLED, so the potential of the second node N2 is changed from the potential thereof in the P3 stage by ΔV=VSS+VOLED−V1+Vth. At this time, the potential of the third node N3 is V1+ΔV=VSS+VOLED+Vth due to the coupling of the second capacitor C2, and at this time, the difference in voltage between the gate and the drain of the driving transistor DT1 is Vgs=$V_{N1}$+$V_{N3}$−$V_{N2}$=Vdata+Vth, and the driving current in the driving transistor DT1 is I=k(Vgs−Vth)$^2$=k(Vdata+Vth−Vth)$^2$=k(Vdata)$^2$, so that the organic light-emitting diode OLED is driven by the driving current in the driving transistor DT1 to emit light.

Fifth Embodiment

Figure 11:
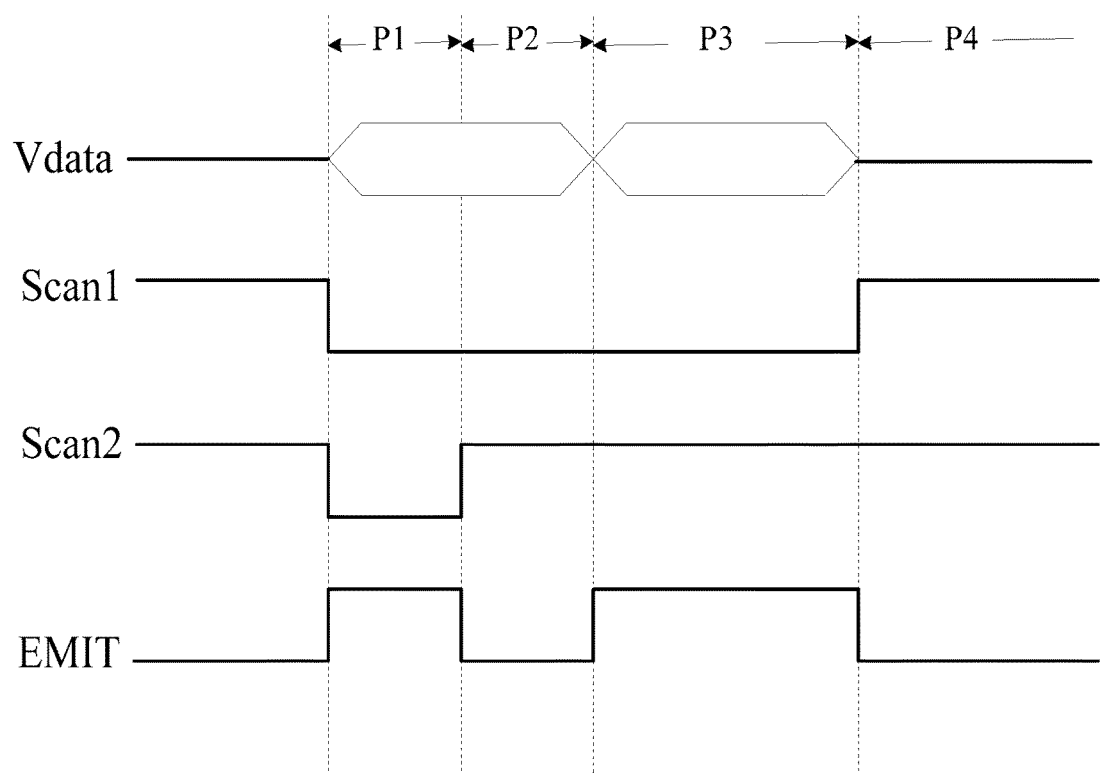
FIG. 11 shows a timing diagram corresponding to the pixel circuit illustrated in FIG. 4 or FIG. 6.

Taking the structure of the pixel circuit illustrated in FIG. 4 as an example, and a corresponding input-output timing diagram thereof is as illustrated in FIG. 11. In one embodiment, there are generally four selected stages including a node initialization stage P1, a threshold detection stage P2, a data writing stage P3, and a light-emission stage P4 shown in the input-output timing diagram as illustrated in FIG. 11.

In the node initialization stage P1, EMIT=1, Scan1=0, and Scan2=0.

With Scan1=0, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1. With Scan2=0, the fourth switch transistor T4 is switched on to provide the second node N2 with the reset signal V2 transmitted from the reset signal terminal Vint, so the potential of the second node N2 is V2. With EMIT=1, the first switch transistor T1 is switched off, and the organic light-emitting diode OLED does not emit light.

In the threshold detection stage P2, EMIT=0, Scan1=0, and Scan2=1.

With Scan1=0, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1, and the driving transistor DT1 is switched on. With Scan2=1, the fourth switch transistor T4 is switched off. With EMIT=0, the first switch transistor T1 is switched on to provide the driving transistor DT1 with the first voltage signal transmitted from the first voltage signal terminal VDD, and at this time, the potential of the second node N2 is the reference signal V1 minus the threshold voltage Vth of the driving transistor, so the potential of the second node N2 is lower than the sum of the potential of the second voltage signal terminal VSS, and the potential of the light-emitting element OLED itself, i.e., $V_{N2}$=V1−Vth<VSS+VOLED, so the organic light-emitting diode OLED does not emit light.

In the data writing stage P3, EMIT=1, Scan1=0, and Scan2=1.

With Scan1=0, the second switch transistor T2 is switched on to provide the first node N1 with the data signal Vdata transmitted from the data signal terminal Data, so the potential of the first node N1 is Vdata; and the third switch transistor T3 is switched on to provide the third node N3 with the reference signal V1 transmitted from the reference signal terminal Vref, so the potential of the third node N3 is V1. With Scan2=1, the fourth switch transistor T4 is switched off, and at this time, the potential of the second node N2 is V1−Vth. With EMIT=1, the first switch transistor T1 is switched off, and the organic light-emitting diode OLED does not emit light.

In the light-emission stage P4, EMIT=0, Scan1=1, and Scan2=1.

With Scan1=1, the second switch transistor T2 and the third switch transistor T3 are switched off, and the potential of the first node N1 is maintained at the potential as in the P3 stage, so the potential of the first node N1 is Vdata. With EMIT=0, the first switch transistor T1 is switched on to provide the fourth node N4 with the voltage output from the first voltage signal terminal VDD, and the light-emitting element OLED is driven by the driving transistor DT1 to emit light; and at this time, the potential of the second node N2 is VSS+VOLED, so the potential of the second node N2 is changed from the potential thereof in the P3 stage by ΔV=VSS+VOLED−V1+Vth. At this time, the potential of the third node N3 is V1+ΔV=VSS+VOLED+Vth due to the coupling of the second capacitor C2, and the difference in voltage between the gate and the drain of the driving transistor DT1 is Vgs=$V_{N1}$+$V_{N3}$−$V_{N2}$=Vdata+Vth, and the driving current in the driving transistor DT1 is I=k(Vgs−Vth)$^2$=k(Vdata+Vth−Vth)$^2$=k(Vdata)$^2$, so that the organic light-emitting diode OLED is driven by the driving current in the driving transistor DT1 to emit light.

Sixth Embodiment

Figure 12:
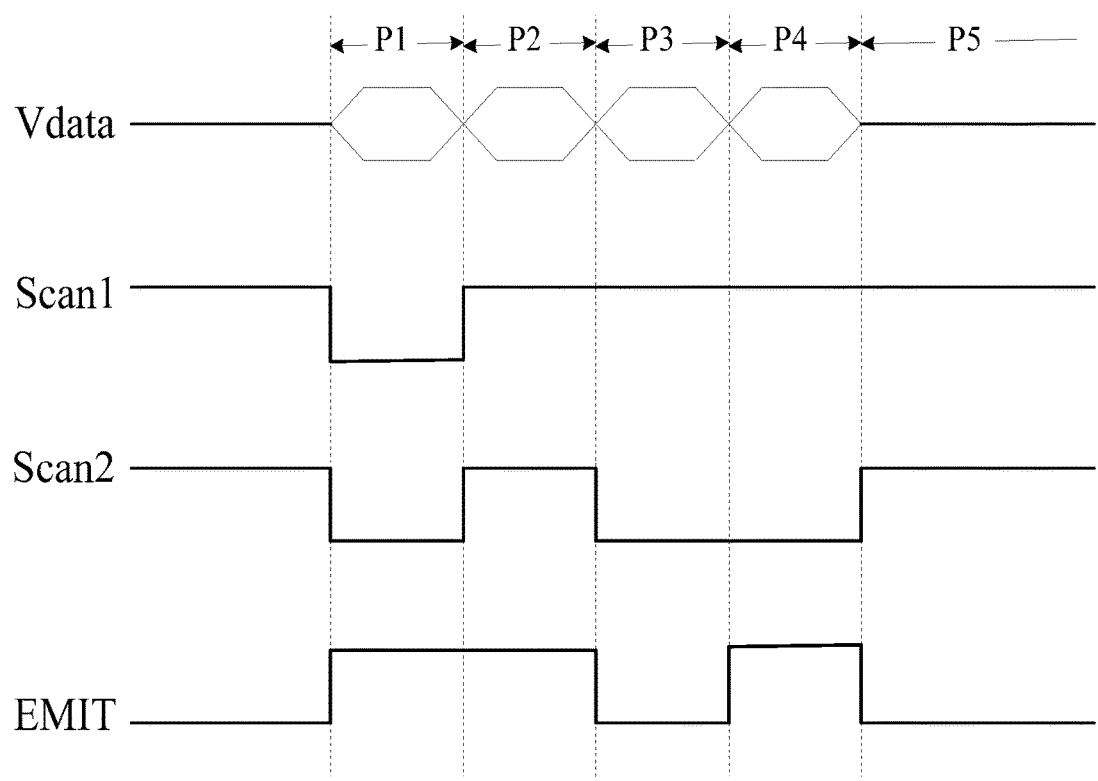
FIG. 12 shows another timing diagram corresponding to the pixel circuit illustrated in FIG. 4 or FIG. 6.

Taking the structure of the pixel circuit illustrated in FIG. 6 as an example, and a corresponding input-output timing diagram thereof is as illustrated in FIG. 12. In one embodiment, there are generally five selected stages including a node initialization stage P1, a hold stage P5, a threshold detection stage P2, a data writing stage P3, and a light-emission stage P4 shown in the input-output timing diagram as illustrated in FIG. 10, where this timing is applicable in the case there is also the 0$^{th}$ row of pixels before the first row of pixels, and the extension direction of gates is specified as the row direction. While the respective rows of pixel circuits are being scanned, the node initialization stage P1 and the hold stage P5 of the next row of pixels are performed at the same time as the threshold detection stage P2 and the data writing stage P3 of the previous row of pixels, and this timing is preset to thereby lengthen a period of time of the threshold detection stage P2. As in the fifth embodiment, it takes a period of time of 1H to perform the four stages, where the period of time of 1H is a period of time it takes to scan a row of pixels, and it takes a period of time of ¼H to perform the threshold detection stage P2; and in the timing according to the sixth embodiment, since the node initialization stage P1 and the hold stage P5 of the next row of pixels are performed at the same time as the threshold detection stage P2 and the data writing stage P3 of the previous row of pixels, it takes a period of time of 2H to perform the four stages throughout the timing, and it takes a period of time of ½H to perform the threshold detection stage P2, so that the period of time of the threshold detection stage P2 is lengthened, thus lengthening a period of time for detecting the threshold voltage, and making the threshold voltage detected more accurately, which may alleviate non-uniformity of a displayed image as a result of inaccurate detection of the threshold voltage detected in a period of time shortened due to a larger number of pixels.

In the node initialization stage P1, EMIT=1, Scan1=0, and Scan2=0.

With Scan1=0, the second switch transistor T2 is switched on to provide the first node N1 with the first reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1. With Scan2=0, the fourth switch transistor T4 is switched on to provide the fourth node N4 with the reset signal V2 transmitted from the reset signal terminal Vint, so the potential of the fourth node N4 is V2. With EMIT=1, the first switch transistor T1 is switched off, and the organic light-emitting diode OLED does not emit light.

In the hold stage P5, EMIT=1, Scan1=1, and Scan2=1.

With EMIT=1, Scan1=1, and Scan2=1, the respective switch transistors are switched off, and the respective nodes maintain their potentials as in the last stage.

In the threshold detection stage P2, EMIT=0, Scan1=0, and Scan2=1.

With Scan1=0, the second switch transistor T2 is switched on to provide the first node N1 with the reference signal V1 transmitted from the data signal terminal Data, so the potential of the first node N1 is V1; and the third switch transistor T3 is switched on to provide the third node N3 with the reference signal V1 transmitted from the reference signal terminal Vref, so the potential of the third node N3 is V1, and the driving transistor DT1 is switched on. With Scan2=1, the fourth switch transistor T4 is switched off. With EMIT=0, the first switch transistor T1 is switched on to provide the driving transistor DT1 with the first voltage signal transmitted from the first voltage signal terminal VDD, and at this time, the potential of the second node N2 is the reference signal V1 minus the threshold voltage Vth of the driving transistor, so the potential of the second node N2 is lower than the sum of the potential of the second voltage signal terminal VSS, and the potential of the light-emitting element OLED itself, i.e., $V_{N2}$=V1−Vth<VSS+VOLED, so the organic light-emitting diode OLED does not emit light.

In the data writing stage P3, EMIT=1, Scan1=0, and Scan2=1.

With Scan1=0, the second switch transistor T2 is switched on to provide the first node N1 with the data signal Vdata transmitted from the data signal terminal Data, so the potential of the first node N1 is Vdata; and the third switch transistor T3 is switched on to provide the third node N3 with the reference signal V1 transmitted from the reference signal terminal Vref, so the potential of the third node N3 is V1. With Scan2=1, the fourth switch transistor T4 is switched off, and at this time, the potential of the second node N2 is V1−Vth. With EMIT=1, the first switch transistor T1 is switched off, and the organic light-emitting diode OLED does not emit light.

In the light-emission stage P4, EMIT=0, Scan1=1, and Scan2=1.

With Scan1=1, the second switch transistor T2 and the third switch transistor T3 are switched off, and the potential of the first node N1 is maintained at the potential as in the P3 stage, so the potential of the first node N1 is Vdata. With EMIT=0, the first switch transistor T1 is switched on to provide the fourth node N4 with the voltage output from the first voltage signal terminal VDD, and the light-emitting element OLED is driven by the driving transistor DT1 to emit light; and at this time, the potential of the second node N2 is VSS+VOLED, so the potential of the second node N2 is changed from the potential thereof in the P3 stage by ΔV=VSS+VOLED−V1+Vth. At this time, the potential of the third node N3 is V1+ΔV=Vss+VOLED+Vth due to the coupling of the second capacitor C2, and the difference in voltage between the gate and the drain of the driving transistor DT1 is Vgs=$V_{N1}$+$V_N$3−$V_{N2}$=Vdata+Vth, and the driving current in the driving transistor DT1 is I=k(Vgs−Vth)$^2$=k(Vdata+Vth−Vth)$^2$=k(Vdata)$^2$, so that the organic light-emitting diode OLED is driven by the driving current in the driving transistor DT1 to emit light.

Figure 13:
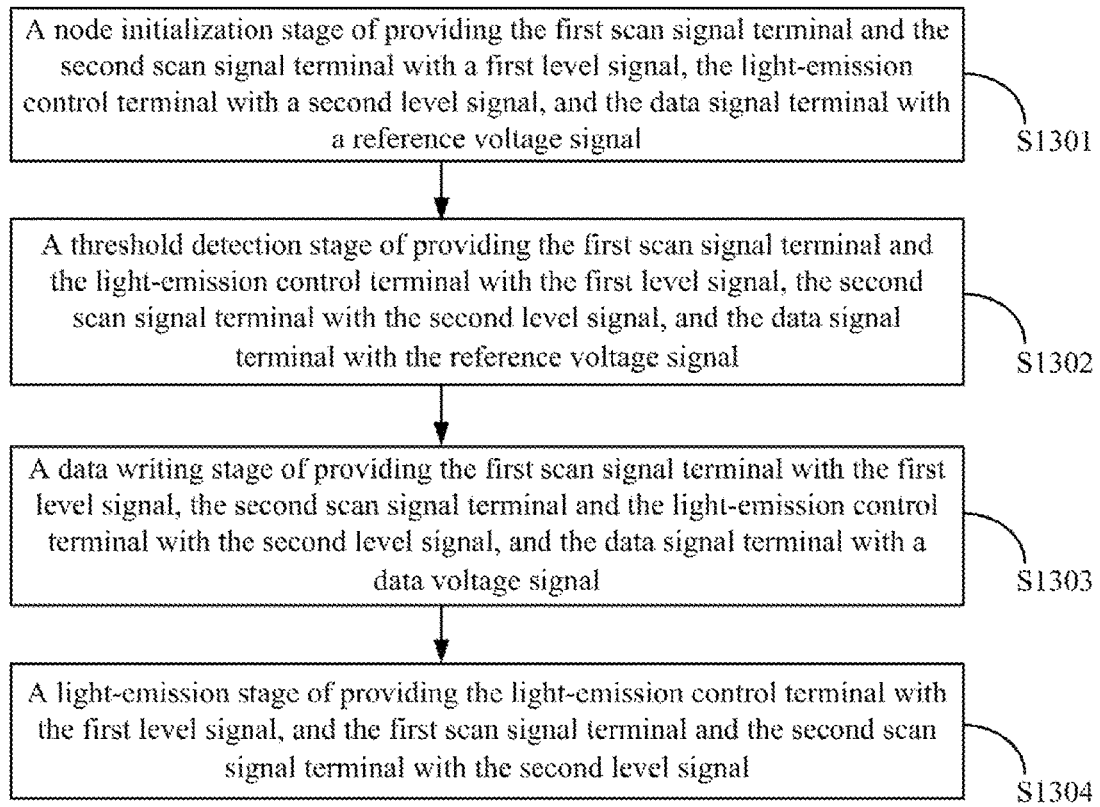
FIG. 13 shows a flow chart of a method for driving a pixel circuit according to an embodiment of the disclosure.

Based upon the same inventive idea, an embodiment of the disclosure further provides a method for driving a pixel circuit, and as illustrated in FIG. 13 which shows a flow chart of a method for driving the pixel circuit above according to an embodiment of the disclosure, the method includes the following stages:

S1301: in a node initialization stage, providing the first scan signal terminal and the second scan signal terminal with a first level signal, the light-emission control terminal with a second level signal, and the data signal terminal with a reference voltage signal;

S1302: in a threshold detection stage, providing the first scan signal terminal and the light-emission control terminal with the first level signal, the second scan signal terminal with the second level signal, and the data signal terminal with the reference voltage signal;

S1303: in a data writing stage, providing the first scan signal terminal with the first level signal, the second scan signal terminal and the light-emission control terminal with the second level signal, and the data signal terminal with a data voltage signal; and S1304: in a light-emission stage, providing the light-emission control terminal with the first level signal, and the first scan signal terminal and the second scan signal terminal with the second level signal.

In one embodiment, between the node initialization stage and the threshold detection stage, the method above for driving a pixel circuit according to the embodiment of the disclosure further includes:

in a hold stage, providing the first scan signal terminal, the second scan signal terminal, and the light-emission control terminal with the second level signal, and the data signal terminal with a data voltage signal of the previous row of pixels.

As compared with the method above for driving a pixel circuit illustrated in FIG. 13, hold stage is added to the driving method, where the node initialization stage and the hold stage are performed at the same time with the threshold detection stage and the data writing stage of the previous row of pixels, so that the period of time of the threshold detection stage of each row of pixels is lengthened, thus making the threshold voltage of the driving transistor detected more accurately, which may alleviate non-uniformity of a displayed image as a result of inaccurate detection of the threshold voltage detected in a period of time shortened due to a larger number of pixels.

In one embodiment, in the method above for driving a pixel circuit according to the embodiment of the disclosure, when all the switch transistors are N-type transistors, the first level signal above is a high-level signal, and correspondingly the second level signal is a low-level signal; or when all the switch transistors are P-type transistors, the first level signal may be a low-level signal, and correspondingly the second level signal is a high-level signal, although the embodiment of the disclosure will not be limited thereto, and the first and second level signals can be determined dependent upon whether the switch transistors are N-type transistors or P-type transistors.

The particular process of the method above for driving a pixel circuit has been described in details in the first to fourth embodiments, so a repeated description thereof will be omitted here.

Figure 14:
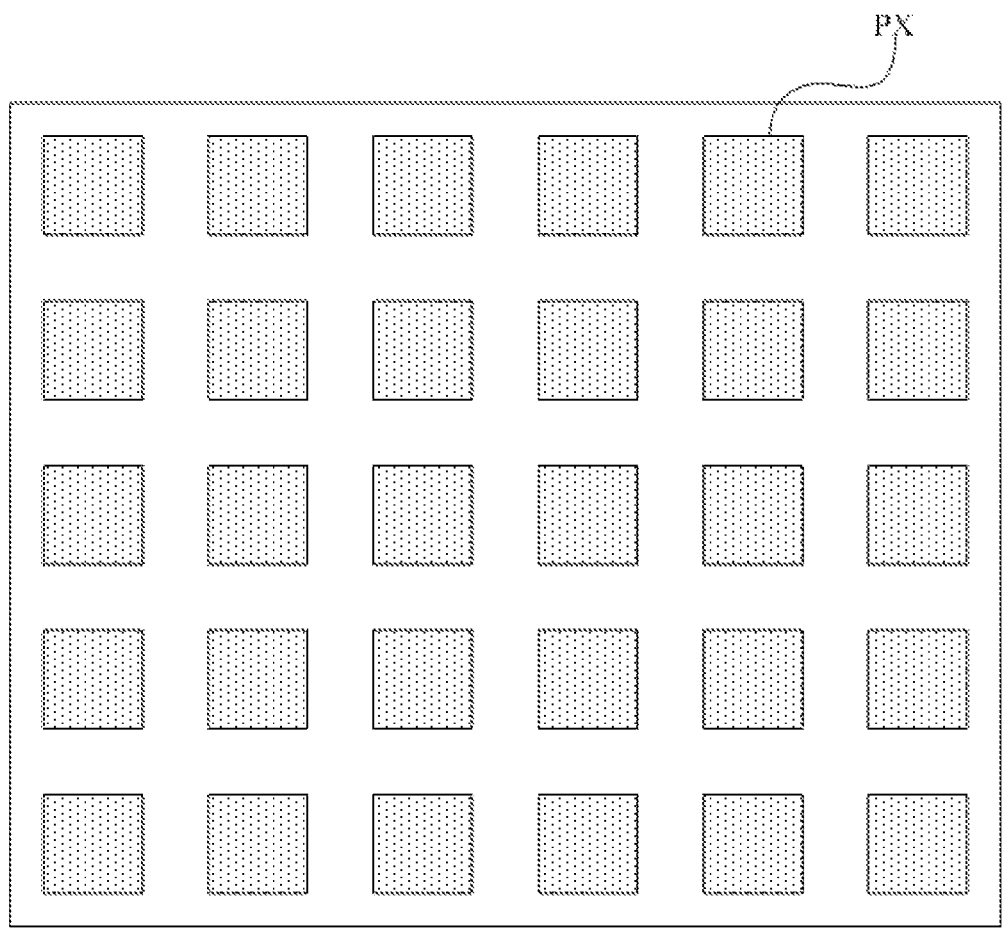
FIG. 14 shows a schematic structural diagram of an arrangement pattern of pixels in an organic light-emitting display panel according to an embodiment of the disclosure.

Based upon the same inventive idea, an embodiment of the disclosure further provides an organic light-emitting display panel, and as illustrated in FIG. 14 which shows a schematic structural diagram of an arrangement pattern of pixels in an organic light-emitting display panel according to an embodiment of the disclosure. The organic light-emitting display panel can includes a plurality of pixel circuits PX according to any one of the above embodiments of the disclosure, which are arranged in a matrix. Since the organic light-emitting display panel addresses the problem under a similar principle to the pixel circuit above, reference can be made to the implementation of the pixel circuit above for an implementation of the organic light-emitting display panel, so a repeated description thereof will be omitted here.

Figure 15:
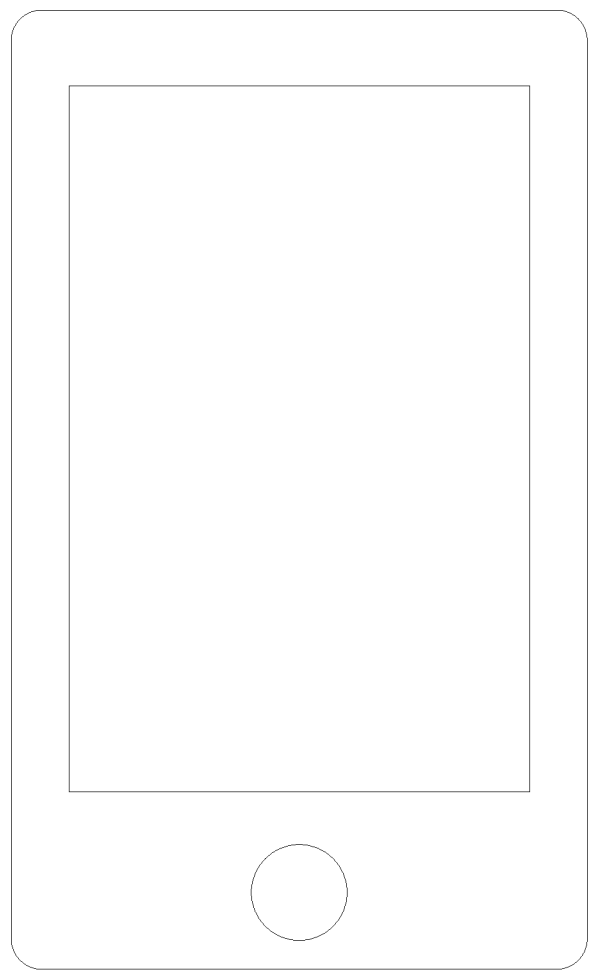
FIG. 15 shows a schematic structural diagram of a display device according to an embodiment of the disclosure.

Based upon the same inventive idea, as illustrated in FIG. 15 which shows a schematic structural diagram of a display device according to an embodiment of the disclosure, an embodiment of the disclosure further provides a display device including the organic light-emitting display panel above according to the embodiment of the disclosure. The display device can be a monitor, a mobile phone, a TV set, a notebook computer, an electronic paper, a digital photo frame, a navigator, an all-in-one computer, etc.

In the pixel circuit, the method for driving the same, the display panel, and the display device according to the embodiments of the disclosure, the pixel circuit includes the driving transistor in a double-gate structure, the first switch transistor, the second switch transistor, the third switch transistor, the fourth switch transistor, the first capacitor, the second capacitor, and the light-emitting element. The respective transistors and capacitors above cooperate with each other to compensate for threshold voltage of the driving transistor, so that driving current to drive the light-emitting element to emit light is only dependent upon the voltage of the data signal, the light-emitting element is avoided from being affected by the threshold voltage of the driver control module, and when the same data signal is applied to different pixel elements, an image at the same brightness can be displayed, thus improving uniformity of the brightness of the image in a display area on a display device, and also making it less difficult to adjust gamma voltage in the pixel circuit, and further optimizing an optional range of the data signal, which may encourage lower power consumption, where the pixel circuit becomes more stable due to the double-gate structure of the driving transistor.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A pixel circuit, comprising:
a driving transistor in a double-gate structure, a first switch transistor, a second switch transistor, a third switch transistor, a fourth switch transistor, a first capacitor, a second capacitor, and a light-emitting element, wherein:
the second switch transistor is configured to be controlled by a signal of a first scan signal terminal to provide a first gate of the driving transistor with a signal of a data signal terminal;
the fourth switch transistor is configured to be controlled by a signal of a second scan signal terminal to provide a first electrode of the driving transistor, or a second electrode of the driving transistor, with a signal of a reset signal terminal;
the third switch transistor is configured to be controlled by the signal of the first scan signal terminal to provide a second gate of the driving transistor with a signal of a reference signal terminal;
the first switch transistor is configured to be controlled by a signal of a light-emission control terminal to provide the first electrode of the driving transistor with a signal of a first voltage signal terminal;
the first capacitor is configured to maintain a stable difference in voltage between the first gate of the driving transistor, and the first voltage signal terminal;
the second capacitor is configured to maintain a stable difference in voltage between the second electrode of the driving transistor, and the second gate of the driving transistor;
the light-emitting element has a first terminal connected with the second electrode of the driving transistor, and a second terminal connected with a second voltage signal terminal; and
the driving transistor is configured to be controlled by the first switch transistor, the first capacitor, and the second capacitor to drive the light-emitting element to emit light.

2. The pixel circuit according to claim 1, wherein the first gate of the driving transistor, and the second gate of the driving transistor are located respectively on two sides of an active layer of the driving transistor.

3. The pixel circuit according to claim 2, wherein the first gate of the driving transistor is located over the active layer of the driving transistor, and a first gate insulation layer is arranged between the first gate of the driving transistor and the active layer of the driving transistor; and
the second gate of the driving transistor is located under the active layer of the driving transistor, and a second gate insulation layer is arranged between the second gate of the driving transistor and the active layer of the driving transistor.

4. The pixel circuit according to claim 2, wherein the first gate of the driving transistor is located under the active layer of the driving transistor, and a first gate insulation layer is further arranged between the first gate of the driving transistor, and the active layer of the driving transistor; and
the second gate of the driving transistor is located over the active layer of the driving transistor, and a second gate insulation layer is further arranged between the second gate of the driving transistor, and the active layer of the driving transistor.

5. The pixel circuit according to claim 1, wherein the first switch transistor has a gate connected with the light-emission control terminal, and a first electrode connected with the first voltage signal terminal, and a second electrode connected with the second electrode of the driving transistor, or a second electrode connected respectively with the second electrode of the driving transistor, and a second electrode of the fourth switch transistor.

6. The pixel circuit according to claim 1, wherein the second switch transistor has a gate connected with the first scan signal terminal, a first electrode connected with the data signal terminal, and a second electrode connected with the first gate of the driving transistor.

7. The pixel circuit according to claim 1, wherein the third switch transistor has a gate connected with the first scan signal terminal, a first electrode connected with the reference signal terminal, and a second electrode connected with the second gate of the driving transistor.

8. The pixel circuit according to claim 1, wherein the fourth switch transistor has a gate connected with the second scan signal terminal, a first electrode connected with the reset signal terminal, and the second electrode connected with the first electrode of the driving transistor, or the second electrode connected respectively with the second electrode of the driving transistor, and the second electrode of the first switch transistor.

9. The pixel circuit according to claim 1, wherein the first capacitor has a first terminal connected with the first gate of the driving transistor, and a second terminal connected with the first voltage signal terminal.

10. The pixel circuit according to claim 1, wherein the second capacitor has a first terminal connected with the first electrode of the driving transistor, and a second terminal connected respectively with the second gate of the driving transistor, and the second electrode of the third switch transistor.

11. The pixel circuit according to claim 1, wherein all the switch transistors are N-type transistors or P-type transistors.

12. The pixel circuit according to claim 11, wherein at least one of the switch transistors is in a double-gate structure.

13. A method for driving the pixel circuit according to claim 1, the method comprising:
in a node initialization stage, providing the first scan signal terminal and the second scan signal terminal with a first level signal, the light-emission control terminal with a second level signal, and the data signal terminal with a reference voltage signal;
in a threshold detection stage, providing the first scan signal terminal and the light-emission control terminal with the first level signal, the second scan signal terminal with the second level signal, and the data signal terminal with the reference voltage signal;
in a data writing stage, providing the first scan signal terminal with the first level signal, the second scan signal terminal and the light-emission control terminal with the second level signal, and the data signal terminal with a data voltage signal; and
in a light-emission stage, providing the light-emission control terminal with the first level signal, and the first scan signal terminal and the second scan signal terminal with the second level signal.

14. The method for driving the pixel circuit according to claim 13, between the node initialization stage and the threshold detection stage, the method further comprises:
in a hold stage, providing the first scan signal terminal, the second scan signal terminal, and the light-emission control terminal with the second level signal, and the data signal terminal with a data voltage signal for a previous row of pixels.

15. An organic light-emitting display panel, comprising a plurality of pixel circuits arranged in a matrix, wherein each of the pixel circuits comprises: a driving transistor in a double-gate structure, a first switch transistor, a second switch transistor, a third switch transistor, a fourth switch transistor, a first capacitor, a second capacitor, and a light-emitting element, wherein:
the second switch transistor is configured to be controlled by a signal of a first scan signal terminal to provide a first gate of the driving transistor with a signal of a data signal terminal;
the fourth switch transistor is configured to be controlled by a signal of a second scan signal terminal to provide a first electrode of the driving transistor, or a second electrode of the driving transistor, with a signal of a reset signal terminal;
the third switch transistor is configured to be controlled by the signal of the first scan signal terminal to provide a second gate of the driving transistor with a signal of a reference signal terminal;
the first switch transistor is configured to be controlled by a signal of a light-emission control terminal to provide the first electrode of the driving transistor with a signal of a first voltage signal terminal;
the first capacitor is configured to maintain a stable difference in voltage between the first gate of the driving transistor, and the first voltage signal terminal;
the second capacitor is configured to maintain a stable difference in voltage between the second electrode of the driving transistor, and the second gate of the driving transistor;
the light-emitting element has a first terminal connected with the second electrode of the driving transistor, and a second terminal connected with a second voltage signal terminal; and
the driving transistor is configured to be controlled by the first switch transistor, the first capacitor, and the second capacitor to drive the light-emitting element to emit light.

16. A display device, comprising:
an organic light-emitting display panel, comprising a plurality of pixel circuits arranged in a matrix, wherein each of the pixel circuits comprises: a driving transistor in a double-gate structure, a first switch transistor, a second switch transistor, a third switch transistor, a fourth switch transistor, a first capacitor, a second capacitor, and a light-emitting element, wherein:
the second switch transistor is configured to be controlled by a signal of a first scan signal terminal to provide a first gate of the driving transistor with a signal of a data signal terminal;
the fourth switch transistor is configured to be controlled by a signal of a second scan signal terminal to provide a first electrode of the driving transistor, or a second electrode of the driving transistor, with a signal of a reset signal terminal;
the third switch transistor is configured to be controlled by the signal of the first scan signal terminal to provide a second gate of the driving transistor with a signal of a reference signal terminal;
the first switch transistor is configured to be controlled by a signal of a light-emission control terminal to provide the first electrode of the driving transistor with a signal of a first voltage signal terminal;
the first capacitor is configured to maintain a stable difference in voltage between the first gate of the driving transistor, and the first voltage signal terminal;
the second capacitor is configured to maintain a stable difference in voltage between the second electrode of the driving transistor, and the second gate of the driving transistor;
the light-emitting element has a first terminal connected with the second electrode of the driving transistor, and a second terminal connected with a second voltage signal terminal; and
the driving transistor is configured to be controlled by the first switch transistor, the first capacitor, and the second capacitor to drive the light-emitting element to emit light.

* * * * *